(12) United States Patent
Kohira et al.

(10) Patent No.: US 8,377,809 B2
(45) Date of Patent: Feb. 19, 2013

(54) METHOD OF FABRICATING SEMICONDUCTOR DEVICE

(75) Inventors: Masatsugu Kohira, Osaka (JP); Yasushi Funakoshi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/202,861

(22) PCT Filed: Feb. 24, 2010

(86) PCT No.: PCT/JP2010/052850
§ 371 (c)(1),
(2), (4) Date: Aug. 23, 2011

(87) PCT Pub. No.: WO2010/101054
PCT Pub. Date: Sep. 10, 2010

(65) Prior Publication Data
US 2011/0300697 A1    Dec. 8, 2011

(30) Foreign Application Priority Data
Mar. 2, 2009  (JP) ................................. 2009-048205

(51) Int. Cl.
*H01L 21/22* (2006.01)
(52) U.S. Cl. ........................................................ 438/546
(58) Field of Classification Search ............ 257/E21.135
See application file for complete search history.

(56) References Cited

U.S. PATENT DOCUMENTS

| 5,077,587 A * | 12/1991 | Albergo et al. ................. 257/96 |
| 2002/0046765 A1* | 4/2002 | Uematsu et al. ............... 136/256 |
| 2009/0026494 A1* | 1/2009 | Itzler ............................. 257/186 |
| 2009/0068783 A1* | 3/2009 | Borden .......................... 438/57 |

FOREIGN PATENT DOCUMENTS

| JP | 2007-134655 | 5/2007 |
| JP | 2008-78665 | 4/2008 |
| JP | 2008-186927 | 8/2008 |
| JP | 2008-311291 | 12/2008 |
| WO | WO 2007/081510 | 7/2007 |

OTHER PUBLICATIONS

International Search Report for PCT/JP2010/052850, mailed May 25, 2010.

* cited by examiner

*Primary Examiner* — Thao P. Le
(74) *Attorney, Agent, or Firm* — Nixon & Vanderhye, P.C.

(57) ABSTRACT

Disclosed is a method of fabricating a semiconductor device, including the steps of forming a diffusion preventing mask on a surface of a semiconductor substrate, applying a dopant diffusing agent containing a dopant of a first conductivity type or a second conductivity type onto the surface of the semiconductor substrate at a spacing from the diffusion preventing mask, and forming a dopant diffusion layer by diffusing the dopant from the dopant diffusing agent into the semiconductor substrate.

3 Claims, 7 Drawing Sheets

METHOD OF FABRICATING SEMICONDUCTOR DEVICE

This application is the U.S. national phase of International Application No. PCT/JP2010/052850, filed 24 Feb. 2010, which designated the U.S. and claims priority to JP Application No. 2009-048205, filed 2 Mar. 2009, the entire contents of each of which are hereby incorporated by reference.

TECHNICAL FIELD

The present invention relates to a method of fabricating a semiconductor device, and more particularly to a method of fabricating a semiconductor device capable of preventing reduction in dopant concentration in a dopant diffusion layer to prevent degradation in characteristics of the semiconductor device.

BACKGROUND ART

In recent years, development of clean energy is desired due to the problem of exhaustion of energy resources, the global environmental problem such as increase in $CO_2$ in the atmosphere, and the like, and photovoltaic generation particularly utilizing solar cells among photoelectric conversion elements is being developed, practically applied, and progressed as a new energy source.

A typical solar cell is a bifacial solar cell fabricated by diffusing impurities of a conductivity type opposite to that of a monocrystalline or polycrystalline silicon substrate, for example, into a light-receiving surface of the silicon substrate to form a pn-junction, and forming electrodes at the light-receiving surface and the back surface opposite to the light-receiving surface, respectively. In the bifacial solar cell, it is also common to diffuse impurities of the same conductivity type as that of the silicon substrate, into the back surface of the silicon substrate at high concentration, thereby increasing outputs by a back surface field effect.

Research and development is also being made on a back electrode type solar cell with no electrode formed at a light-receiving surface of a silicon substrate but with an electrode formed only at the back surface (see, e.g., Pamphlet of WO2007/081510 (Patent Literature 1)).

Referring to schematic sectional views of FIG. 7(a) and g. 7(b), a method of fabricating a back electrode type solar cell described in Patent Literature 1 will be described below.

First, as shown in FIG. 7(a), a low-concentration n-type dopant source 101, a high-concentration n-type dopant source 102, a low-concentration p-type dopant source 103, and a high-concentration p-type dopant source 104 are formed by inkjet printing or screen printing at the back surface of a silicon substrate 100 which is a surface opposite to the side where a textured structure 108 is formed.

Figure 7:
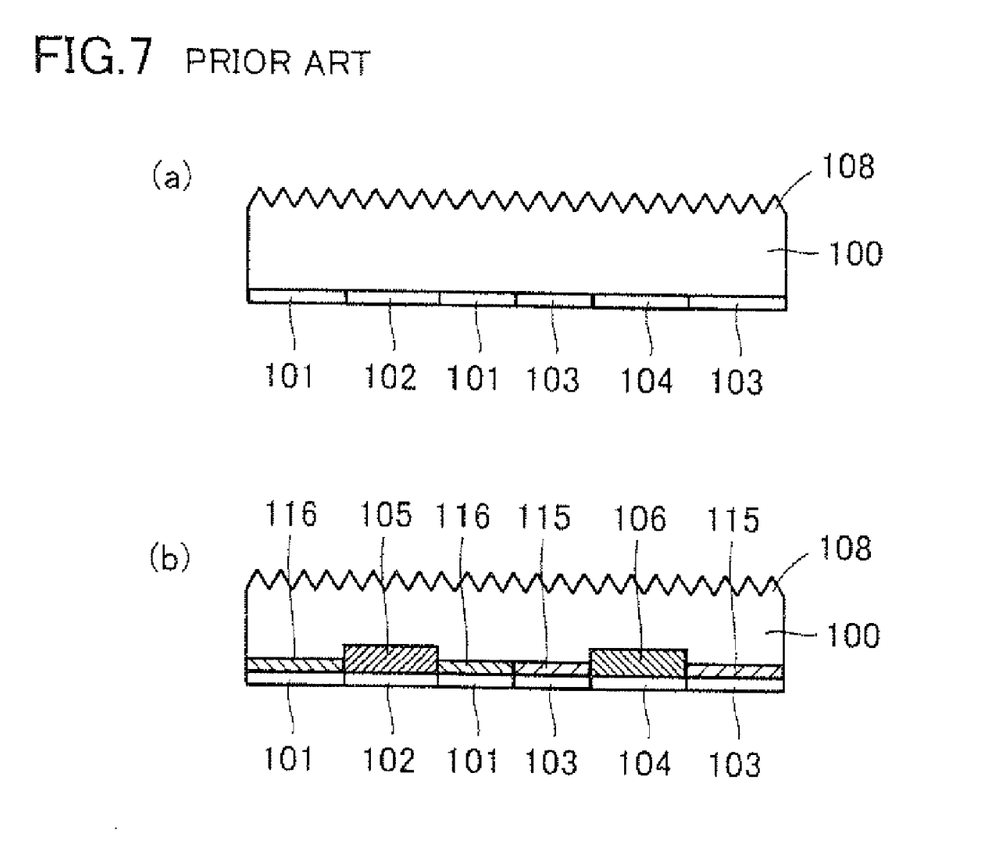

Then, as shown in FIG. 7 (b), silicon substrate 100 is heat-treated to diffuse an n-type dopant at low concentration from low-concentration n-type dopant source 101 to form a low-concentration n-type-dopant diffusion layer 116 in the back surface of silicon substrate 100, and diffuse an n-type dopant at high concentration from high-concentration n-type dopant source 102 to form a high-concentration n-type-dopant diffusion layer 105. Further, a p-type dopant is diffused at low concentration from low-concentration p-type dopant source 103 to form a low-concentration p-type-dopant diffusion layer 115, and a p-type dopant is diffused at high concentration from high-concentration p-type dopant source 104 to form a high-concentration p-type-dopant diffusion layer 106.

Latest researches have revealed that a back electrode type solar cell of high characteristics is obtained when a low-concentration dopant diffusion layer such as low-concentration n-type-dopant diffusion layer 116 and low-concentration p-type-dopant diffusion layer 115 are formed between high-concentration dopant diffusion layers of different conductivity types such as high-concentration n-type-dopant diffusion layer 105 and high-concentration p-type-dopant diffusion layer 106 in the back surface of silicon substrate 100, as shown in FIG. 7(b).

However, in the method disclosed in Patent Literature 1 described above, silicon substrate 100 is heat-treated after low-concentration n-type dopant source 101, high-concentration n-type dopant source 102, low-concentration p-type dopant source 103, and high-concentration p-type dopant source 104 are formed by inkjet printing or screen printing.

Therefore, the method disclosed in Patent Literature 1 described above is disadvantageous in that diffusion of dopants in the back surface of the silicon substrate is not controllable since the dopants out-diffuse from the above-described dopant sources during heat treatment of silicon substrate 100, causing the dopants of different conductivity types to diffuse mutually in the gas phase surrounding silicon substrate 100.

Therefore, to prevent out diffusion of dopants from dopant sources, a method of forming a mask on the dopant sources and then heat-treating is proposed (see, e.g., Japanese Patent Laying-Open No. 2008-78665 (Patent Literature 2)).

Referring to schematic sectional views of FIG. 8(a) to FIG. 8(e), a method of fabricating a back electrode type solar cell disclosed in Patent Literature 2 will be described below.

Figure 8:
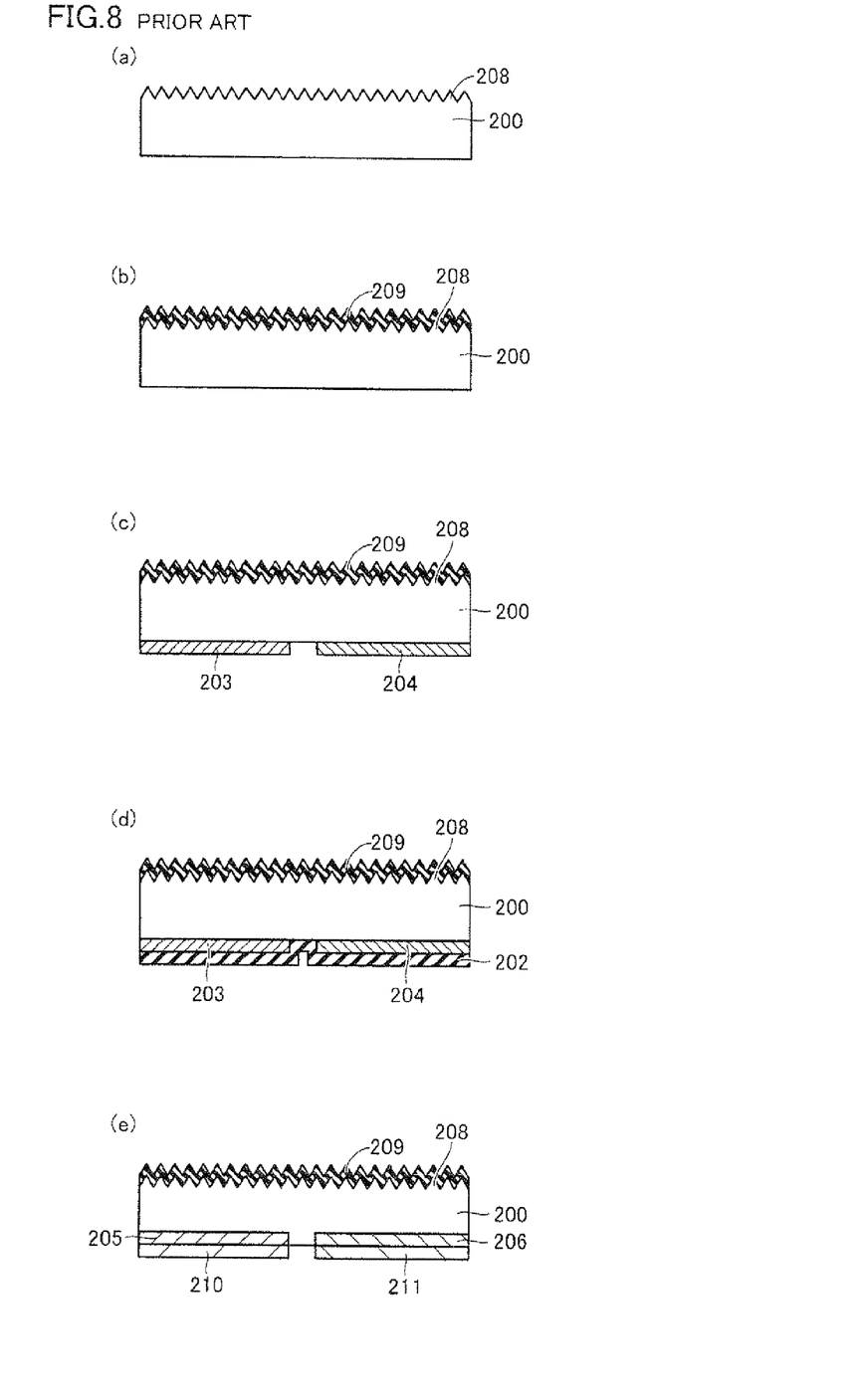

First, as shown in FIG. 8(a), a textured structure 208 is formed at one surface of a silicon substrate 200.

Then, as shown in FIG. 8(b), an oxide layer 209 is formed on textured structure 208 at the surface of silicon substrate 200.

Then, as shown in FIG. 8(c), a p-type doping paste 203 containing a p-type dopant and an n-type doping paste 204 containing an n-type dopant are applied at a predetermined spacing at the back surface of silicon substrate 200 of p- or n-conductivity type which is the surface opposite to the side where textured structure 208 is formed.

Then, as shown in FIG. 8(d), an oxide layer 202 is formed to cover p-type doping paste 203 and n-type doping paste 204 at the back surface of silicon substrate 200.

Thereafter, silicon substrate 200 is heat-treated to diffuse the p-type dopant from p-type doping paste 203 and diffuse the n-type dopant from n-type doping paste 204 into the back surface of silicon substrate 200. A p-type-dopant diffusion layer 205 and an n-type-dopant diffusion layer 206 are thereby formed, respectively, in the back surface of silicon substrate 200, as shown in FIG. 8(e).

Then, a metallized portion 210 is formed on p-type-dopant diffusion layer 205 in the back surface of the silicon substrate 200, and a metallized portion 211 is formed on n-type-dopant diffusion layer 206, thereby fabricating the back electrode type solar cell disclosed in Patent Literature 2.

CITATION LIST

Patent Literature

PTL 1: Pamphlet of WO2007/081510
PTL 2: Japanese Patent Laying-Open No. 2008-78665

SUMMARY OF INVENTION

Technical Problem

However, the method of fabricating a back electrode type solar cell disclosed in Patent Literature 2, wherein silicon substrate 200 is heat-treated after p-type doping paste 203 and n-type doping paste 204 applied onto the back surface of silicon substrate 200 are covered with oxide layer 202, and then the p-type dopant and the n-type dopant are diffused, is disadvantageous in that the p-type dopant in p-type doping paste 203 and the n-type dopant in n-type doping paste 204 move into oxide layer 202, respectively, causing reduction in p-type dopant concentration in p-type-dopant diffusion layer 205 and reduction in n-type dopant concentration in n-type-dopant diffusion layer 206, following which the contact resistance between p-type-dopant diffusion layer 205 and metallized portion 210 and the contact resistance between n-type-dopant diffusion layer 206 and metallized portion 210 both increase, which degrades characteristics of the back electrode type solar cell.

Patent Literature 1 is also disadvantageous in that the back electrode type solar cell is degraded in characteristics due to movement of the p-type dopant in low-concentration p-type dopant source 103 into low-concentration n-type dopant source 101 or movement of the n-type dopant in low-concentration n-type dopant source 101 into low-concentration p-type dopant source 103 since low-concentration n-type dopant source 101 and low-concentration p-type dopant source 103 contact each other.

These drawbacks are not limited to back electrode type solar cells, but are common to other semiconductor devices.

In light of the above-described circumstances, an object of the present invention is to provide a method of fabricating a semiconductor device capable of preventing reduction in dopant concentration in dopant diffusion layers to prevent degradation in characteristics of the semiconductor device.

Solution to Problem

The present invention is a method of fabricating a semiconductor device, including the steps of forming a diffusion preventing mask on a surface of a semiconductor substrate, applying a dopant diffusing agent containing a dopant of one of a first conductivity type and a second conductivity type onto the surface of the semiconductor substrate at a spacing from the diffusion preventing mask, and forming a dopant diffusion layer by diffusing the dopant from the dopant diffusing agent into the semiconductor substrate.

In the method of fabricating a semiconductor device according to the present invention, in the step of forming the diffusion preventing mask, the diffusion preventing mask is preferably formed such that a spacing between adjacent diffusion preventing masks is more than or equal to 100 μm.

In the method of fabricating a semiconductor device according to the present invention, in the step of forming the diffusion preventing mask, the diffusion preventing mask is formed to be patterned by printing.

In the method of fabricating a semiconductor device according to the present invention, in the step of applying the dopant diffusing agent, the dopant diffusing agent is applied to be patterned by printing.

Advantageous Effects of Invention

According to the present invention, a method of fabricating a semiconductor device capable of preventing reduction in dopant concentration in dopant diffusion layers to prevent degradation in characteristics of the semiconductor device can be provided.

BRIEF DESCRIPTION OF DRAWINGS

FIGS. 1(*a*) to (*j*) are schematic sectional views illustrating a method of fabricating a solar cell according to a first embodiment of the present invention.

FIGS. 5(*a*) to (*h*) are schematic sectional views illustrating a method of fabricating a solar cell according to a second embodiment of the present invention.

FIGS. 6(*a*) to (*f*) are schematic sectional views illustrating a method of fabricating a solar cell according to a third embodiment of the present invention.

FIGS. 7(*a*) and (*b*) are schematic sectional views illustrating a method of fabricating a conventional back electrode type solar cell according to Patent Literature 1.

FIGS. 8(*a*) to (*e*) are schematic sectional views illustrating a method of fabricating a conventional back electrode type solar cell according to Patent Literature 2.

DESCRIPTION OF EMBODIMENTS

Hereinafter, embodiments of the present invention will be described. It is noted that the same reference characters shall represent the same or a corresponding portion in the drawings of the present invention.

First Embodiment

Referring to the schematic sectional views of FIG. 1(*a*) to FIG. 1(*j*), an example of a method of fabricating a solar cell which is an example of a semiconductor device according to the present invention will now be described.

Figure 1:
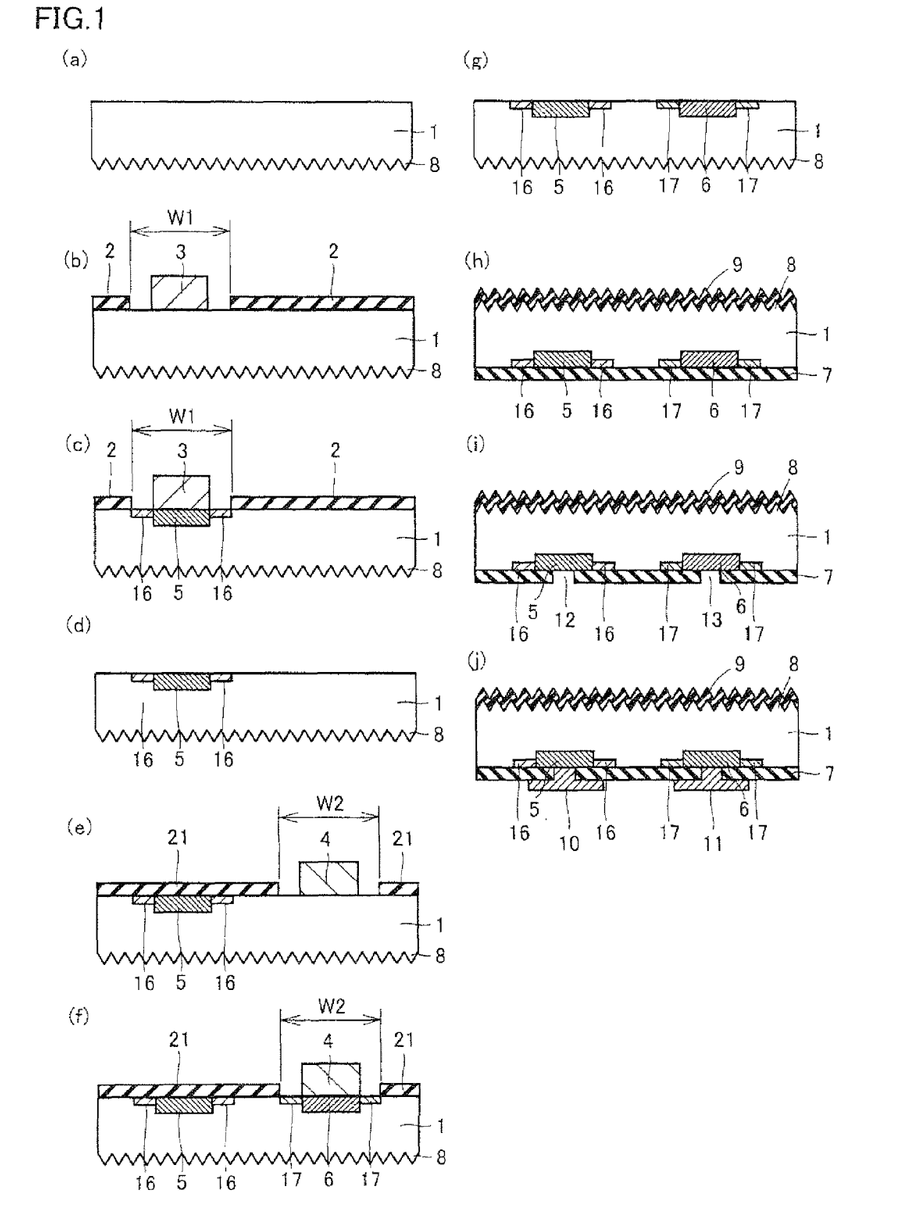

First, as shown in FIG. 1(*a*), a semiconductor substrate 1 with a textured structure 8 made of, for example, pyramid-like irregularities or the like formed thereon is prepared. Herein, semiconductor substrate 1 is not particularly limited only if it is a substrate made of semiconductor. For example, a silicon substrate obtained by slicing a silicon ingot can be used. Moreover, semiconductor substrate 1 may be of n-conductivity type or p-conductivity type.

When using a silicon substrate as semiconductor substrate 1, a silicon substrate from which slice damage produced by slicing of a silicon ingot has been removed may be used, for example. It is noted that above-described removal of slice damage can be performed by etching the surface of the silicon substrate after slicing with a mixed acid of a hydrogen fluoride aqueous solution and nitric acid, or an alkaline aqueous solution such as sodium hydroxide, for example.

Semiconductor substrate 1 is not particularly limited in size and shape, and can have a quadrangular surface having a thickness more than or equal to 100 μm and less than or equal to 300 μm, and a length of one side more than or equal to 100 mm and less than or equal to 200 mm, for example.

Textured structure 8 can be formed by etching the surface of semiconductor substrate 1, for example. It is noted that, when semiconductor substrate 1 is made of a silicon substrate, etching of the surface of semiconductor substrate 1 can be performed by using an etching solution obtained by heating a solution obtained by adding isopropyl alcohol to an alkaline aqueous solution such as, for example, sodium hydroxide or potassium hydroxide, to more than or equal to 70° C. and less than or equal to 80° C., for example, thereby etching the surface of semiconductor substrate 1.

It is noted that textured structure 8 does not need to be formed, however, to increase the amount of sunlight incident on semiconductor substrate 1, textured structure 8 is preferably formed. Moreover, textured structure 8 is preferably formed only at the light-receiving surface of the solar cell.

Then, as shown in FIG. 1(*b*), a first diffusion preventing mask 2 is formed on the back surface of semiconductor substrate 1 which is the surface opposite to the side where textured structure 8 is formed such that an opening is formed at a predetermined position, and a first-conductivity-type-dopant diffusing agent 3 containing a first-conductivity-type dopant is applied at a position corresponding to the above-described opening at a predetermined spacing so as not to contact first diffusion preventing mask 2. Herein, first diffusion preventing mask 2 can be formed in strip shape that extends from the front side to the back side of FIG. 1(*b*), for example, and first-conductivity-type-dopant diffusing agent 3 can be applied in strip shape that extends from the front side to the back side of FIG. 1(*b*), for example.

First diffusion preventing mask 2 can be implemented by a single layer or laminated layers of a silicon oxide film, a silicon nitride film, a titanium oxide film, or an aluminum oxide film, for example.

Herein, first diffusion preventing mask 2 can be formed, for example, by forming a film made of the above-described material on the entire back surface of semiconductor substrate 1 by a CVD (Chemical Vapor Deposition) technique or the like, and then removing part of the film corresponding to the above-described opening. The above-described removal of part of the film can be performed by, for example, a method of using photolithography to form a resist pattern having an opening at a position corresponding to the part of the film to be removed, on a surface of the above-described film, and then removing the film by etching or the like through the opening of the resist pattern, a method of applying an etching paste to a portion corresponding to the above-described part of the film to be removed, and then heating to etch and remove the above-described film, or the like.

It is noted that the etching paste can be implemented by, for example, one that contains hydrogen fluoride, ammonium and phosphoric acid as etching components and contains water, an organic solvent and a thickener as components other than the etching components.

Alternatively, first diffusion preventing mask 2 can be formed, for example, by a method of printing a masking paste having an opening at a position corresponding to the position where the above-described opening is formed, in a predetermined shape on the back surface of semiconductor substrate 1 and patterning, and then heat-treating the masking paste for densification. The method of printing a masking paste can be implemented by, for example, spray coating, coating with a dispenser, inkjet printing, screen printing, letterpress printing, intaglio printing, or planography.

It is noted that the masking paste can be implemented by, for example, one that contains an organic solvent, water, a thickener, and a silane compound. Alternatively, the masking paste can be implemented by one that does not contain a thickener.

Herein, the organic solvent can be implemented by, for example, ethylene glycol, methyl cellosolve, methyl cellosolve acetate, ethyl cellosolve, diethyl cellosolve, cellosolve acetate, ethylene glycol monophenyl ether, methoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol acetate, triethyl glycol, triethylene glycol monomethyl ether, triethylene glycol monoethyl ether, tetraethylene glycol, liquid polyethylene glycol, propylene glycol, propylene glycol monomethyl ether, propylene glycol monoethyl ether, propylene glycol monobutyl ether, 1-butoxyethoxypropanol, dipropylglycol, dipropylene glycol monomethyl ether, dipropylene glycol monoethyl ether, tripropylene glycol monomethyl ether, polypropylene glycol, trimethylene glycol, butanedial, 1,5-pentanedial, hexylene glycol, glycerine, glyceryl acetate, glycerine diacetate, glyceryl triacetate, trimethylol propane, 1,2,6-hexanetriol, 1,2-propanediol, 1,5-pentanediol, octanediol, 1,2-butanediol, 1,4-butanediol, 1,3-butanediol, dioxane, trioxane, tetrahydrofuran, tetrahydropyran, methylal, diethyl acetal, methyl ethyl ketone, methyl isobutyl ketone, diethyl ketone, acetonylacetone, diacetone alcohol, methyl formate, ethyl formate, propyl formate, methyl acetate, or ethyl acetate, either alone or in combination of two or more kinds of them.

The thickener can be implemented by, for example, castor oil, bentonite, nitrocellulose, ethyl cellulose, polyvinylpyrrolidone, starch, gelatin, alginic acid, amorphous silica, polyvinyl butyral, sodium carboxymethylcellulose, polyamide resin, an organic castor oil derivative, diamide wax, swelling of polyacrylate, polyether urea polyurethane, or polyether polyol, either alone or in combination of two or more kinds of them.

The silane compound can be implemented by, for example, a silane compound expressed by General Formula (1) below.

$$R^1{}_n Si(OR^2)_{4-n} \tag{1}$$

It is noted that, in General Formula (1) above, $R^1$ represents a methyl group, an ethyl group, or a phenyl group. In General Formula (1) above, $R^2$ represents a straight or branched alkyl group having 1 to 4 carbon atoms, such as a methyl group, an ethyl group, a propyl group, an isopropyl group, and a butyl group. In General Formula (1) above, n represents an integer of 0 to 4.

The silane compound expressed by General Formula (1) above can be implemented by, for example, tetramethoxysilane, tetraethoxysilane, tetrapropoxysilane, tetrabutoxysilane, or their salts (tetraethylorthosilicate, etc.), either alone or in combination of two or more kinds of them.

When semiconductor substrate 1 is a semiconductor substrate of the first conductivity type, a spacing W1 between adjacent first diffusion preventing masks 2 is preferably more than or equal to 100 μm, and more preferably, more than or equal to 200 μm. When spacing W1 between adjacent first diffusion preventing masks 2 is more than or equal to 100 μm, and more particularly, more than or equal to 200 μm, application of first-conductivity-type-dopant diffusing agent 3 is easier, which is more likely to result in stable mass production of solar cells.

The thickness of first diffusion preventing mask 2 is preferably more than or equal to 50 nm, and more preferably, more than or equal to 400 nm. When the thickness of first diffusion preventing mask 2 is more than or equal to 50 nm, and particularly more than or equal to 400 nm, diffusion of the first-conductivity-type dopant into semiconductor substrate 1 due to out diffusion of the first-conductivity-type dopant from first-conductivity-type-dopant diffusing agent 3 is likely to be prevented more effectively.

First-conductivity-type-dopant diffusing agent 3 can be implemented by, for example, one that contains a first-conductivity-type dopant source. When the first conductivity type is of n-type, the first-conductivity-type dopant source can be implemented by, for example, a compound containing a phosphorus atom such as phosphate, phosphorus oxide, diphosphorus pentoxide, phosphoric acid or an organic phosphorous compound, either alone or in combination of two or more kinds of them, and when the first conductivity type is of p-type, can be implemented by, for example, a compound containing a boron atom and/or an aluminum atom such as boron oxide, boric acid, an organic boron compound, a boron-aluminum compound, an organoaluminum compound, or an aluminum salt, either alone or in combination of two or more kinds of them.

The component of first-conductivity-type-dopant diffusing agent 3 other than the first-conductivity-type dopant source can be implemented by, for example, one that contains a solvent, a silane compound and a thickener.

The solvent can be implemented by, for example, water, methanol, ethanol, ethylene glycol monobutyl ether, diethylene glycol monobutyl ether, propylene glycol monomethyl ether, dipropylene glycol monomethyl ether, 1,2-propanediol, 1,4-butanediol, 1,3-butanediol, dioxane, trioxane, tetrahydrofuran, tetrahydropyran methylal, diethyl acetal, methyl ethyl ketone, methyl isobutyl ketone, diethyl ketone, acetonylacetone, diacetone alcohol, methyl formate, ethyl formate, propyl formate, methyl acetate, ethyl acetate, acetic anhydride, or N-methylpyrrolidone, either alone or in combination of two or more kinds of them.

The silane compound can be implemented by, for example, the silane compound expressed by General Formula (1) above, either alone or in combination of two or more kinds of them.

When the thickener is contained, one similar to the thickener used for the above-described masking paste can be used.

Application of first-conductivity-type-dopant diffusing agent 3 is preferably performed to be printed in a predetermined shape and patterned. The method of printing first-conductivity-type-dopant diffusing agent 3 can be implemented by, for example, spray coating, coating with a dispenser, inkjet printing, screen printing, letterpress printing, intaglio printing, or planography.

Then, as shown in FIG. 1(c), semiconductor substrate 1 with first-conductivity-type-dopant diffusing agent 3 applied thereto is heat-treated, thereby diffusing the first-conductivity-type dopant from first-conductivity-type-dopant diffusing agent 3 into semiconductor substrate 1 by solid phase diffusion to form high-concentration first-conductivity-type-dopant diffusion layer 5, and diffusing the first-conductivity-type dopant from first-conductivity-type-dopant diffusing agent 3 into semiconductor substrate 1 by out diffusion to form a low-concentration first-conductivity-type-dopant diffusion layer 16.

Herein, although conditions for the above-described heat treatment of semiconductor substrate 1 are not particularly limited, it is preferable to heat semiconductor substrate 1 under nitrogen atmosphere for more than or equal to 30 minutes and less than or equal to 60 minutes at a temperature more than or equal to 800° C. and less than or equal to 1000° C., from the viewpoint of stably forming high-concentration first-conductivity-type-dopant diffusion layer 5 and low-concentration first-conductivity-type-dopant diffusion layer 16.

It is noted that the diffusion of the first-conductivity-type dopant from first-conductivity-type-dopant diffusing agent 3 by solid phase diffusion is caused by direct diffusion of the first-conductivity-type dopant from first-conductivity-type-dopant diffusing agent 3 into semiconductor substrate 1.

The diffusion of the first-conductivity-type dopant from first-conductivity-type-dopant diffusing agent 3 by out diffusion is caused by temporal diffusion of the first-conductivity-type dopant from first-conductivity-type-dopant diffusing agent 3 into the gas phase surrounding semiconductor substrate 1, and subsequent diffusion of the first-conductivity-type dopant having been diffused in the gas phase into semiconductor substrate 1.

Then, as shown in FIG. 1(d), first diffusion preventing mask 2 and first-conductivity-type-dopant diffusing agent 3 on the back surface of semiconductor substrate 1 are removed. Accordingly, each surface of high-concentration first-conductivity-type-dopant diffusion layer 5 and low-concentration first-conductivity-type-dopant diffusion layer 16 is exposed at the back surface of semiconductor substrate 1.

Herein, the method of removing first diffusion preventing mask 2 and first-conductivity-type-dopant diffusing agent 3 is not particularly limited, only if it is a method that can remove first diffusion preventing mask 2 and first-conductivity-type-dopant diffusing agent 3 from the back surface of semiconductor substrate 1.

Then, as shown in FIG. 1(e), second diffusion preventing mask 21 is formed on the back surface of semiconductor substrate 1 which is the surface opposite to the side where textured structure 8 is formed such that a predetermined opening is formed, and a second-conductivity-type-dopant diffusing agent 4 containing a second-conductivity-type dopant is applied at a position corresponding to the above-described opening at a predetermined spacing so as not to contact second diffusion preventing mask 21. Herein, second diffusion preventing mask 21 can be formed in strip shape that extends from the front side to the back side of FIG. 1(e), for example, and second-conductivity-type-dopant diffusing agent 4 can be applied in strip shape that extends from the front side to the back side of FIG. 1(e), for example.

Second diffusion preventing mask 21 can be implemented by a single layer or laminated layers of a silicon oxide film, a silicon nitride film, a titanium oxide film, or an aluminum oxide film, for example.

Herein, second diffusion preventing mask 21 can be formed, for example, by forming a film made of the above-described material on the entire back surface of semiconductor substrate 1 by a CVD technique or the like, and then removing part of the film corresponding to the above-described opening. The above-described removal of part of the film can be performed by a method of using photolithography to form a resist pattern having an opening at a position corresponding to the part of the film to be removed, on a surface of the above-described film, and then removing the film by etching or the like through the opening of the resist pattern, a method of applying an etching paste to a portion corresponding to the above-described part of the film to be removed, and then heating to etch and remove the above-described film, or the like.

Alternatively, second diffusion preventing mask 21 can be formed, for example, by a method of printing a masking paste having an opening at a position corresponding to the position where the above-described opening is formed, in a predetermined shape on the back surface of semiconductor substrate 1 and patterning, and then heat-treating the masking paste for densification.

It is noted that the etching paste and the masking paste used for forming second diffusion preventing mask 21 are the same as those described above, description of which is thus omitted here.

When semiconductor substrate 1 is a semiconductor substrate of the first conductivity type, a spacing W2 between adjacent second diffusion preventing masks 21 is preferably more than or equal to 400 μm, and more preferably, more than or equal to 600 μm. When spacing W2 between adjacent second diffusion preventing masks 21 is more than or equal to 400 μm, and more particularly, more than or equal to 600 μm, application of second-conductivity-type-dopant diffusing agent 4 is easier, which is more likely to result in stable mass production of solar cells.

The thickness of second diffusion preventing mask 21 is preferably more than or equal to 50 nm, and more preferably, more than or equal to 400 nm. When the thickness of second diffusion preventing mask 21 is more than or equal to 50 nm, and particularly more than or equal to 400 nm, diffusion of the second-conductivity-type dopant into semiconductor substrate 1 due to out diffusion of the second-conductivity-type dopant from second-conductivity-type-dopant diffusing agent 4 is likely to be prevented more effectively.

Second-conductivity-type-dopant diffusing agent 4 can be implemented by, for example, one that contains a second-conductivity-type dopant source. When the second conductivity type is of n-type, the second-conductivity-type dopant source can be implemented by, for example, a compound containing a phosphorus atom such as phosphate, phosphorus oxide, diphosphorus pentoxide, phosphoric acid or an organic phosphorous compound, either alone or in combination of two or more kinds of them, and when the second conductivity type is of p-type, can be implemented by, for example, a compound containing a boron atom and/or an aluminum atom such as boron oxide, boric acid, an organic boron compound, a boron-aluminum compound, an organoaluminum compound, or an aluminum salt, either alone or in combination of two or more kinds of them.

The component of second-conductivity-type-dopant diffusing agent 4 other than the second-conductivity-type dopant source can be implemented by, for example, one that contains a solvent, a silane compound and a thickener.

The solvent can be implemented by, for example, water, methanol, ethanol, ethylene glycol monobutyl ether, diethylene glycol monobutyl ether, propylene glycol monomethyl ether, dipropylene glycol monomethyl ether, 1,2-propanediol, 1,4-butanediol, 1,3-butanediol, dioxane, trioxane, tetrahydrofuran, tetrahydropyran methylal, diethyl acetal, methyl ethyl ketone, methyl isobutyl ketone, diethyl ketone, acetonylacetone, diacetone alcohol, methyl formate, ethyl formate, propyl formate, methyl acetate, ethyl acetate, acetic anhydride, or N-methylpyrrolidone, either alone or in combination of two or more kinds of them.

The silane compound can be implemented by, for example, the silane compound expressed by General Formula (1) above, either alone or in combination of two or more kinds of them.

When the thickener is contained, one similar to the thickener used for the above-described masking paste can be used.

Application of second-conductivity-type-dopant diffusing agent 4 is preferably performed to be printed in a predetermined shape and patterned. The method of printing second-conductivity-type-dopant diffusing agent 4 can be implemented by, for example, spray coating, coating with a dispenser, inkjet printing, screen printing, letterpress printing, intaglio printing, or planography.

Thereafter, semiconductor substrate 1 with second-conductivity-type-dopant diffusing agent 4 applied thereto is heat-treated. Herein, heat treatment is preferably performed by heating semiconductor substrate 1 under oxygen or nitrogen atmosphere for about 30 minutes at a temperature more than or equal to 400° C. and less than or equal to 800° C.

Then, as shown in FIG. 1(f), semiconductor substrate 1 with second-conductivity-type-dopant diffusing agent 4 applied thereto is heat-treated, thereby diffusing the second-conductivity-type dopant from second-conductivity-type-dopant diffusing agent 4 into semiconductor substrate 1 by solid phase diffusion to form high-concentration second-conductivity-type-dopant diffusion layer 6, and diffusing the second-conductivity-type dopant from second-conductivity-type-dopant diffusing agent 4 into semiconductor substrate 1 by out diffusion to form low-concentration second-conductivity-type-dopant diffusion layer 17.

Herein, although conditions for the above-described heat treatment of semiconductor substrate 1 are not particularly limited, it is preferable to heat semiconductor substrate 1 under nitrogen atmosphere for more than or equal to 30 minutes and less than or equal to 60 minutes at a temperature more than or equal to 800° C. and less than or equal to 1000° C., from the viewpoint of stably forming high-concentration second-conductivity-type-dopant diffusion layer 6 and low-concentration second-conductivity-type-dopant diffusion layer 17.

It is noted that the diffusion of the second-conductivity-type dopant from second-conductivity-type-dopant diffusing agent 4 by solid phase diffusion is caused by direct diffusion of the second-conductivity-type dopant from second-conductivity-type-dopant diffusing agent 4 into semiconductor substrate 1.

The diffusion of the second-conductivity-type dopant from second-conductivity-type-dopant diffusing agent 4 by out diffusion is caused by temporal diffusion of the second-conductivity-type dopant from second-conductivity-type-dopant diffusing agent 4 into the gas phase surrounding semiconductor substrate 1, and subsequent diffusion of the second-conductivity-type dopant having been diffused in the gas phase into semiconductor substrate 1.

Then, as shown in FIG. 1(g), second diffusion preventing mask 21 and second-conductivity-type-dopant diffusing agent 4 on the back surface of semiconductor substrate 1 are removed. Accordingly, each surface of high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17 is exposed at the back surface of semiconductor substrate 1.

Herein, the method of removing second diffusion preventing mask 21 and second-conductivity-type-dopant diffusing agent 4 is not particularly limited, only if it is a method that can remove second diffusion preventing mask 21 and second-conductivity-type-dopant diffusing agent 4 from the back surface of semiconductor substrate 1.

Then, as shown in FIG. 1(h), a passivation film 7 is formed on the back surface of semiconductor substrate 1 where each surface of high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17 is exposed, and an antireflection film 9 is formed on the surface of semiconductor substrate 1 at which textured structure 8 is formed.

Herein, passivation film 7 can be implemented by, for example, a silicon oxide film, a silicon nitride film, a stack of a silicon oxide film and a silicon nitride film, or the like. Passivation film 7 can be formed by a plasma CVD technique or the like, for example.

Antireflection film 9 can be implemented by, for example, a silicon oxide film, a silicon nitride film, a stack of a silicon oxide film and a silicon nitride film, or the like. Antireflection film 9 can be formed by a plasma CVD technique or the like, for example.

Then, as shown in FIG. 1(i), contact hole 12 and contact hole 13 are formed by removing part of passivation film 7 on semiconductor substrate 1 to expose the surface of high-concentration first-conductivity-type-dopant diffusion layer 5 at contact hole 12 and to expose the surface of high-concentration second-conductivity-type-dopant diffusion layer 6 at contact hole 13.

Herein, contact hole 12 and contact hole 13 can be formed by, for example, a method of using photolithography to form a resist pattern having openings at positions corresponding to the portions at which contact hole 12 and contact hole 13 are to be formed, on passivation film 7, and then removing passivation film 7 by etching or the like through the openings of the resist pattern, a method of applying an etching paste to portions corresponding to the portions at which contact hole 12 and contact hole 13 are to be formed, and then heating to etch and remove passivation film 7, or the like.

It is noted that the etching paste can be implemented by one similar to the above-described one, description of which is thus omitted here.

Then, as shown in FIG. 1(j), a first-conductivity-type-specific electrode 10 electrically connected to high-concentration first-conductivity-type-dopant diffusion layer 5 through contact hole 12 is formed, and a second-conductivity-type-specific electrode 11 electrically connected to high-concentration second-conductivity-type-dopant diffusion layer 6 through contact hole 13 is formed.

Herein, first-conductivity-type-specific electrode 10 and second-conductivity-type-specific electrode 11 can be implemented by, for example, electrodes made of metal such as silver.

The back electrode type solar cell can thus be fabricated by the method of fabricating a solar cell according to the present embodiment.

Figure 2:
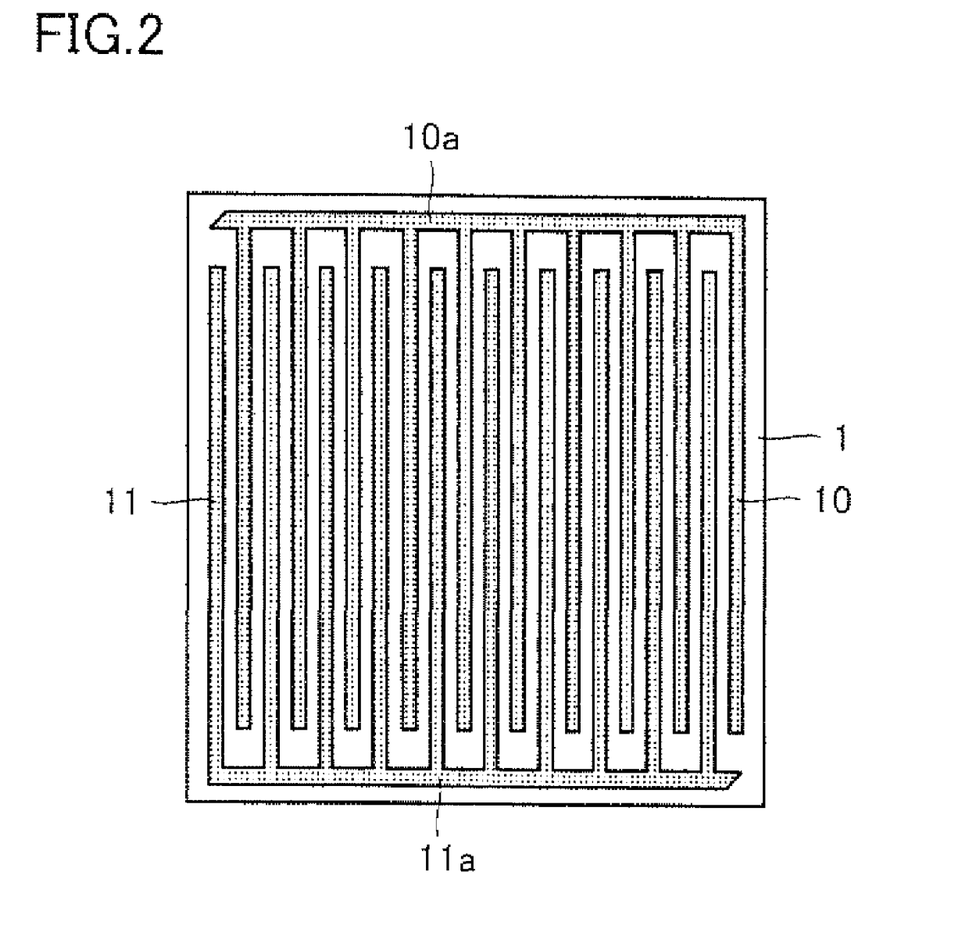
FIG. 2 is a schematic plan view of an example of a back surface of a back electrode type solar cell fabricated by the method of fabricating a solar cell according to the present invention.

FIG. 2 is a schematic plan view of an example of a back surface of a back electrode type solar cell fabricated by the method of fabricating a solar cell according to the present invention.

Herein, as shown in FIG. 2, at the back surface of the back electrode type solar cell, a plurality of strip-shaped first-conductivity-type-specific electrodes 10 and a plurality of strip-shaped second-conductivity-type-specific electrodes 11 are arranged alternately at a spacing. First-conductivity-type-specific electrodes 10 are all electrically connected to a strip-shaped first-conductivity-type-specific current-collecting electrode 10a, and second-conductivity-type-specific electrodes 11 are all electrically connected to a strip-shaped second-conductivity-type-specific current-collecting electrode 11a.

At the back surface of the back electrode type solar cell, high-concentration first-conductivity-type-dopant diffusion layer 5 is arranged under each of the plurality of strip-shaped first-conductivity-type-specific electrodes 10, and high-concentration second-conductivity-type-dopant diffusion layer 6 is arranged under each of the plurality of strip-shaped second-conductivity-type-specific electrodes 11, however, high-concentration first-conductivity-type-dopant diffusion layer 5 and high-concentration second-conductivity-type-dopant diffusion layer 6 are not particularly limited in shape and size. For example, high-concentration first-conductivity-type-dopant diffusion layer 5 and high-concentration second-conductivity-type-dopant diffusion layer 6 may be formed in strip shape along first-conductivity-type-specific electrode 10 and second-conductivity-type-specific electrode 11, respectively, or may be formed in dot shape that contact portions of first-conductivity-type-specific electrode 10 and second-conductivity-type-specific electrode 11, respectively.

Figure 3:
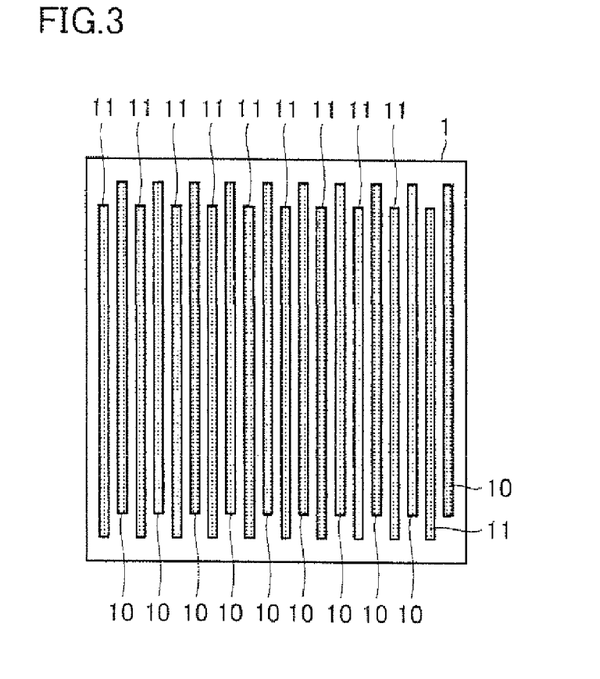
FIG. 3 is a schematic plan view of another example of a back surface of a back electrode type solar cell fabricated by the method of fabricating a solar cell according to the present invention.

FIG. 3 is a schematic plan view of another example of a back surface of a back electrode type solar cell fabricated by the method of fabricating a solar cell according to the present invention. Herein, as shown in FIG. 3, first-conductivity-type-specific electrodes 10 and second-conductivity-type-specific electrodes 11 are each formed in strip shape that extends in the same direction (extending in the vertical direction of FIG. 3), and are arranged alternately in the direction orthogonal to their extending direction.

Figure 4:
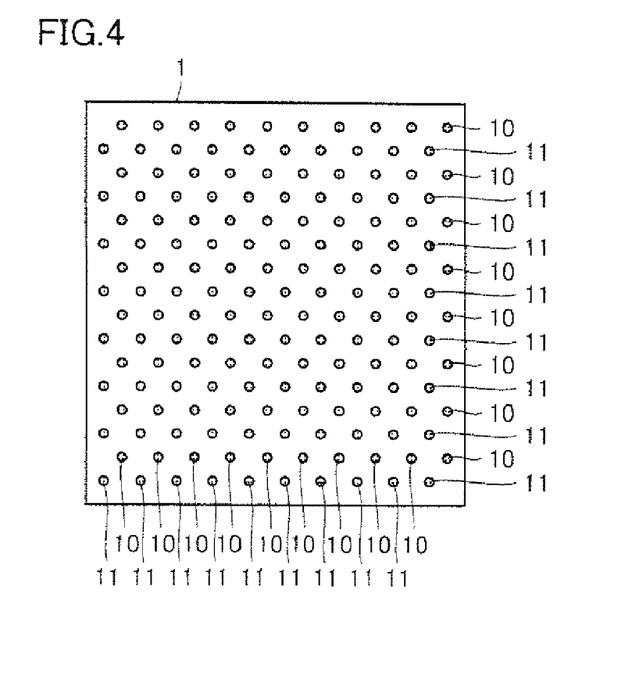
FIG. 4 is a schematic plan view of still another example of a back surface of a back electrode type solar cell fabricated by the method of fabricating a solar cell according to the present invention.

FIG. 4 is a schematic plan view of still another example of a back surface of a back electrode type solar cell fabricated by the method of fabricating a solar cell according to the present invention. Herein, as shown in FIG. 4, first-conductivity-type-specific electrodes 10 and second-conductivity-type-specific electrodes 11 are each formed in dot shape. Rows of dot-shaped first-conductivity-type-specific electrodes 10 (extending in the vertical or horizontal direction of FIG. 4) and rows of dot-shaped second-conductivity-type-specific electrodes 11 (extending in the vertical or horizontal direction of FIG. 4) are arranged alternately at the back surface of semiconductor substrate 1.

It is noted that, although FIG. 1(a) to FIG. 1(j) show only one high-concentration first-conductivity-type-dopant diffusion layer 5 and one high-concentration second-conductivity-type-dopant diffusion layer 6 as being formed in semiconductor substrate 1 for illustration purposes, it is needless to say that a plurality of high-concentration first-conductivity-type-dopant diffusion layers 5 and a plurality of high-concentration second-conductivity-type-dopant diffusion layers 6 may be formed practically.

In the above description, the first conductivity type may be of n- or p-conductivity type, and the second conductivity type only needs to be opposite to the first conductivity type. That is, when the first conductivity is of n-type, the second conductivity type is of p-type, and when the First conductivity is of p-type, the second conductivity type is of n-type.

When the first conductivity type is of p-type, the first-conductivity-type dopant can be implemented by, for example, a p-type dopant such as boron or aluminum. When the first conductivity type is of n-type, the first-conductivity-type dopant can be implemented by, for example, an n-type dopant such as phosphorus.

When the second, conductivity type is of n-type, the second-conductivity-type dopant can be implemented by, for example, an n-type dopant such as phosphorus. When the second conductivity type is of p-type, the second-conductivity-type dopant can be implemented by, for example, a p-type dopant such as boron or aluminum.

As illustrated above, according to the present invention, the dopant diffusing agents are applied onto the semiconductor substrate at a spacing from the diffusion preventing masks, which can prevent the dopants in the dopant diffusing agents from being absorbed into the diffusion preventing masks.

Therefore, according to the present invention, since the amount of dopants in the dopant diffusing agents can be prevented from being reduced by absorption into the diffusion preventing masks, reduction in dopant concentration in the dopant diffusion layers can be prevented, so that the solar cell can be prevented from degrading in characteristics.

Further, according to the present invention, since the diffusion preventing masks disposed on the semiconductor substrate can prevent diffusion of the dopants in the dopant diffusing agents into the semiconductor substrate due to out diffusion, the first-conductivity-type-dopant diffusion layer and the second-conductivity-type-dopant diffusion layer in the semiconductor substrate can be stably formed at desired positions. This facilitates controlling patterning of the first-conductivity-type-dopant diffusion layer and the second-conductivity-type-dopant diffusion layer.

Second Embodiment

The present embodiment features applying first-conductivity-type-dopant diffusing agent 3 at an opening formed between diffusion preventing masks 2 disposed on the back surface of semiconductor substrate 1 and second-conductivity-type-dopant diffusing agent 4 at another opening formed with diffusion preventing mask 2 disposed at the back surface of semiconductor substrate 1, respectively, and then heat-treating semiconductor substrate 1, thereby simultaneously forming high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17. The remaining points are similar to those of the first embodiment.

Referring to the schematic sectional views of FIG. 5(a) to FIG. 5(h), a method of fabricating a solar cell according to the present embodiment will now be described. Although FIG. 5(a) to FIG. 5(h) show only one high-concentration first-conductivity-type-dopant diffusion layer 5 and one high-concentration second-conductivity-type-dopant diffusion layer 6 as being formed in semiconductor substrate 1 for illustration purposes, it is needless to say that a plurality of high-concentration first-conductivity-type-dopant diffusion layers 5 and a plurality of high-concentration second-conductivity-type-dopant diffusion layers 6 may be formed practically.

First, as shown in FIG. 5(a), semiconductor substrate 1 with textured structure 8 made of for example, pyramid-like irregularities or the like formed thereon is prepared.

Then, as shown in FIG. 5(b), first diffusion preventing mask 2 is formed on the back surface of semiconductor substrate 1 which is the surface opposite to the side where textured structure 8 is formed such that an opening is formed at a predetermined position. Herein, first diffusion preventing mask 2 can be formed in strip shape that extends from the front side to the back side of FIG. 5(b), for example. Thereafter, semiconductor substrate 1 with first diffusion preventing mask 2 formed thereon is heat-treated for densification. Herein, it is preferable to heat semiconductor substrate 1 under oxygen or nitrogen atmosphere for about 30 minutes at a temperature more than or equal to 400° C. and less than or equal to 800° C. The spacing between adjacent first diffusion preventing masks 2 is similar to that of the first embodiment.

Then, as shown in FIG. 5(c), first-conductivity-type-dopant diffusing agent 3 containing the first-conductivity-type dopant and second-conductivity-type-dopant diffusing agent 4 containing the second-conductivity-type dopant are applied at positions of the back surface of semiconductor substrate 1 corresponding to the above-described openings at a predetermined spacing so as not to contact first diffusion preventing mask 2. Herein, first-conductivity-type-dopant diffusing agent 3 and second-conductivity-type-dopant diffusing agent 4 can be applied in strip shape that extend from the front side to the back side of FIG. 5(c), for example.

Then, semiconductor substrate 1 with first-conductivity-type-dopant diffusing agent 3 and second-conductivity-type-dopant diffusing agent 4 applied thereto is heat-treated.

Figure 5:
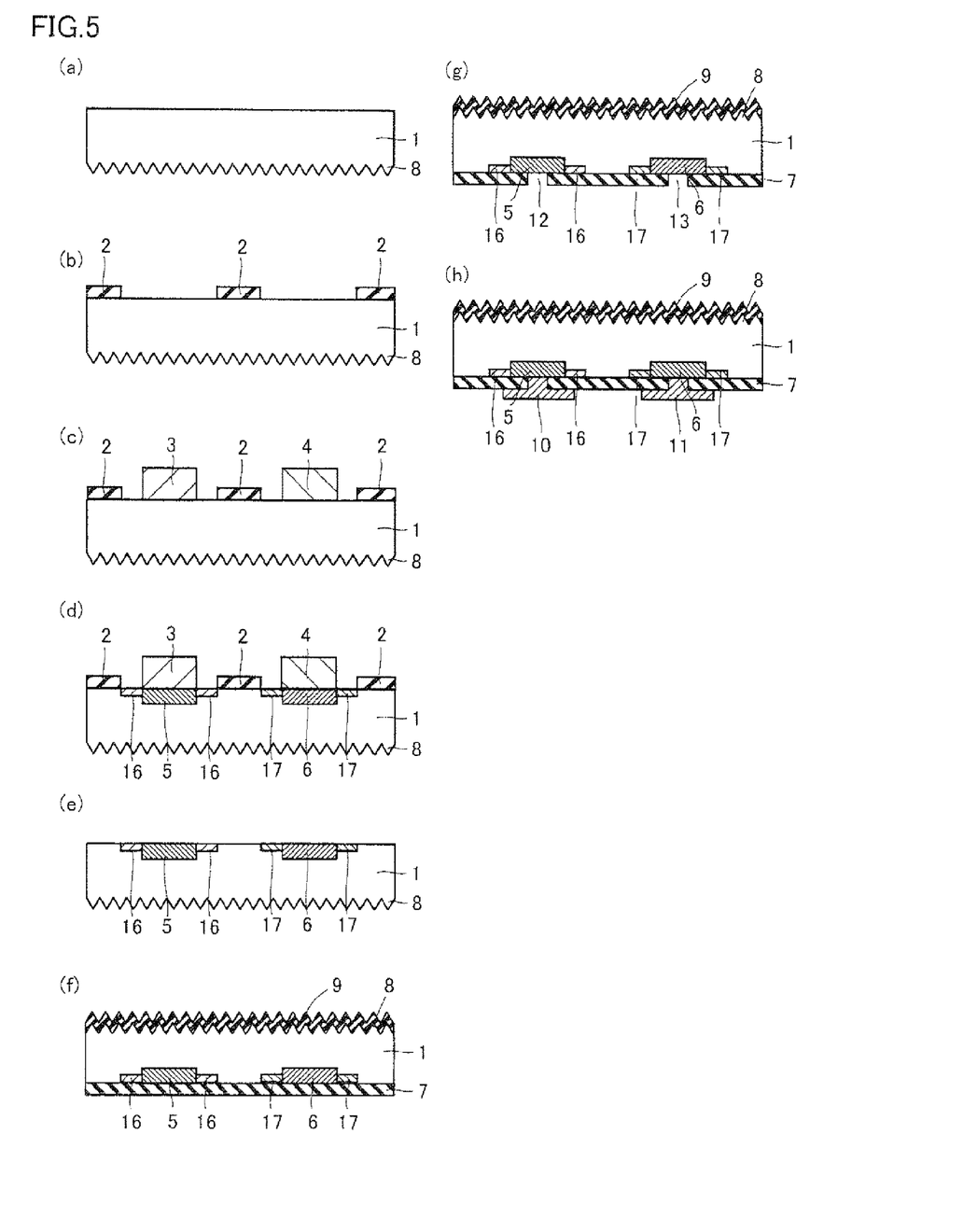

Through this heat treatment of semiconductor substrate 1, as shown in FIG. 5 (d), the first-conductivity-type dopant is diffused from first-conductivity-type-dopant diffusing agent 3 into semiconductor substrate 1 by solid phase diffusion to form high-concentration first-conductivity-type-dopant diffusion layer 5, and the first-conductivity-type dopant is diffused from first-conductivity-type-dopant diffusing agent 3 into semiconductor substrate 1 by out diffusion to form low-concentration first-conductivity-type-dopant diffusion layer 16.

Moreover, the second-conductivity-type dopant is diffused from second-conductivity-type-dopant diffusing agent 4 into semiconductor substrate 1 by solid phase diffusion to form high-concentration second-conductivity-type-dopant diffusion layer 6, and the second-conductivity-type dopant is diffused from second-conductivity-type-dopant diffusing agent 4 into semiconductor substrate 1 by out diffusion to form low-concentration second-conductivity-type-dopant diffusion layer 17.

Herein, although conditions for the above-described heat treatment of semiconductor substrate 1 are not particularly limited, it is preferable to heat semiconductor substrate 1 under nitrogen atmosphere at a temperature more than or equal to 800° C. and less than or equal to 1000° C., from the viewpoint of stably forming high-concentration first-conductivity-type-dopant diffusion layer 5, low-concentration first-conductivity-type-dopant diffusion layer 16, high-concentration second-conductivity-type-dopant diffusion layer 6, and the low-concentration second-conductivity-type-dopant diffusion layer 17.

Then, as shown in FIG. 5(e), first diffusion preventing mask 2, first-conductivity-type-dopant diffusing agent 3 and second-conductivity-type-dopant diffusing agent 4 on the back surface of semiconductor substrate 1 are removed. Accordingly, each surface of high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17 is exposed at the back surface of semiconductor substrate 1.

Then, as shown in FIG. 5(f), passivation film 7 is formed on the back surface of semiconductor substrate 1 where each surface of high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17 is exposed, and antireflection film 9 is formed on the surface of semiconductor substrate 1 at which textured structure 8 is formed.

Then, as shown in FIG. 5(g), contact hole 12 and contact hole 13 are formed by removing part of passivation film 7 on semiconductor substrate 1 to expose the surface of high-concentration first-conductivity-type-dopant diffusion layer 5 at contact hole 12 and to expose the surface of high-concentration second-conductivity-type-dopant diffusion layer 6 at contact hole 13.

Then, as shown in FIG. 5(h), first-conductivity-type-specific electrode 10 electrically connected to high-concentration first-conductivity-type-dopant diffusion layer 5 through contact hole 12 is formed, and second-conductivity-type-specific electrode 11 electrically connected to high-concentration second-conductivity-type-dopant diffusion layer 6 through contact hole 13 is formed.

The back electrode type solar cell can thus be fabricated by the method of fabricating a solar cell according to the present embodiment.

In the case of heat-treating semiconductor substrate 1 after applying both of first-conductivity-type-dopant diffusing agent 3 and second-conductivity-type-dopant diffusing agent 4 onto semiconductor substrate 1 as in the method of fabricating a solar cell according to the present embodiment, heat treatment for forming high-concentration first-conductivity-type-dopant diffusion layer 5, low-concentration first-conductivity-type-dopant diffusion layer 16, high-concentration second-conductivity-type-dopant diffusion layer 6, and low-concentration second-conductivity-type-dopant diffusion layer 17 only needs to be performed once, which can simplify the manufacturing process, and can effectively prevent heat damage to semiconductor substrate 1 and the like caused by heat treatment.

It is noted that description of the present embodiment except the foregoing is similar to that of the first embodiment, and is thus omitted.

Third Embodiment

The present embodiment features fabricating a bifacial solar cell having electrodes at a light-receiving surface and a back surface of a semiconductor substrate, respectively, rather than a back electrode type solar cell.

Referring to the schematic sectional views of FIG. 6(a) to FIG. 6(f), the method of fabricating a solar cell according to the present embodiment will now be described.

Figure 6:
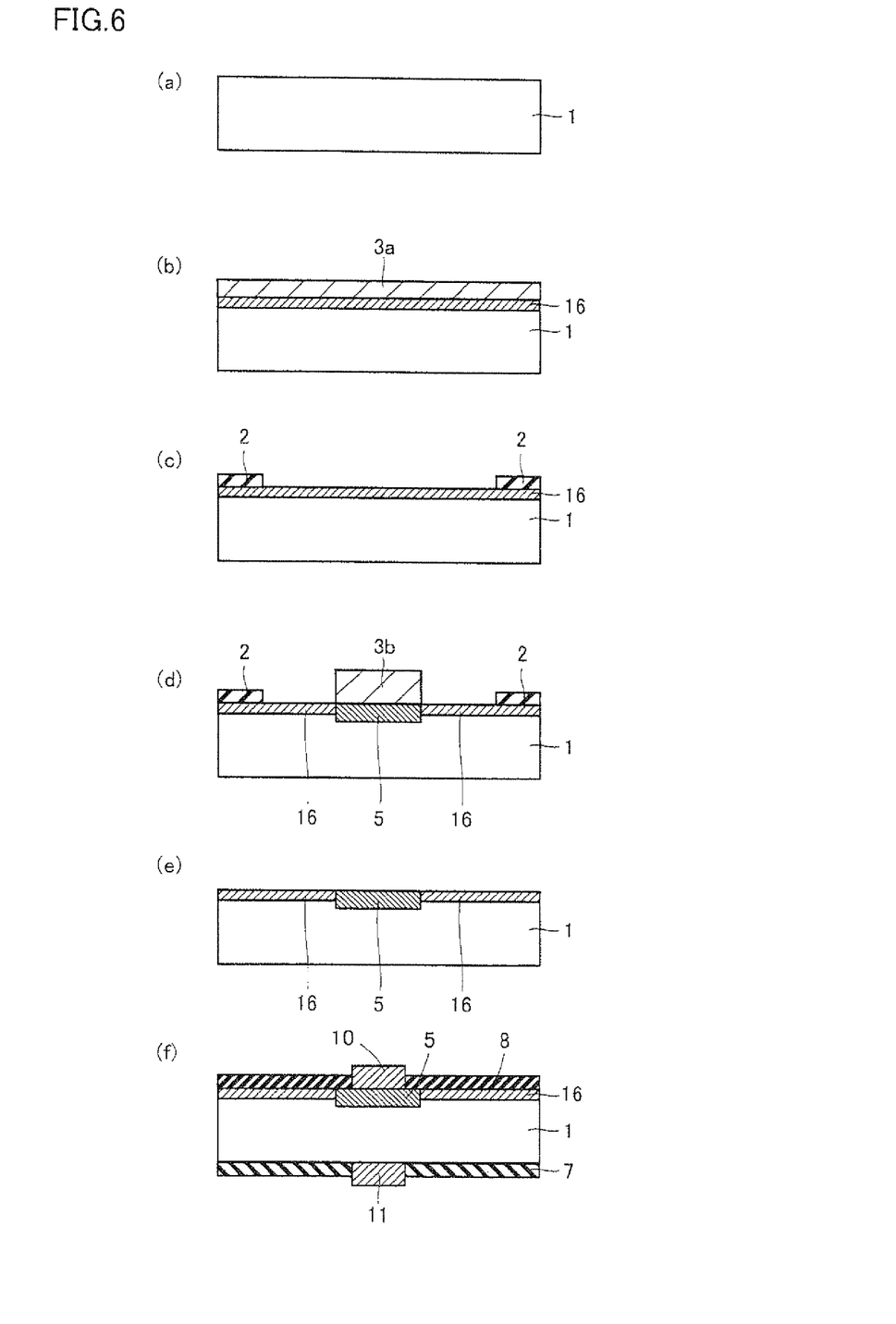

First, as shown in FIG. 6 (a), semiconductor substrate 1 of the second conductivity type with a textured structure (not shown) made of, for example, pyramid-like irregularities or the like formed thereon is prepared.

Then, as shown in FIG. 6(b), a first-conductivity-type-dopant diffusing agent 3a containing a first-conductivity-type dopant is applied to the light-receiving surface of semiconductor substrate 1 which is the surface at the side where the textured structure is formed, and heat treatment is performed, thereby diffusing the first-conductivity-type dopant from first-conductivity-type-dopant diffusing agent 3a into the surface of semiconductor substrate 1 to form low-concentration first-conductivity-type-dopant diffusion layer 16. Herein, although conditions for the heat treatment of semiconductor substrate 1 are not particularly limited, it is preferable to heat semiconductor substrate 1 under nitrogen atmosphere for more than or equal to 10 minutes and less than or equal to 60 minutes at a temperature more than or equal to 600° C. and less than or equal to 900° C., from the viewpoint of stably forming low-concentration first-conductivity-type-dopant diffusion layer 16. Thereafter, first-conductivity-type-dopant diffusing agent 3a is removed from the surface of semiconductor substrate 1. Low-concentration first-conductivity-type-dopant diffusion layer 16 may be formed by gas phase diffusion.

Then, as shown in FIG. 6(c), first diffusion preventing mask 2 is formed on the light-receiving surface of semiconductor substrate 1 which is the surface at the side where the textured structure is formed such that an opening is formed at a predetermined position. Herein, first diffusion preventing mask 2 can be formed in strip shape that extends to the front side and/or the back side of FIG. 6(c). First diffusion preventing mask 2 can be formed by a method similar to that of the first embodiment or the second embodiment.

Then, as shown in FIG. 6(d), a first-conductivity-type-dopant diffusing agent 3h containing a first-conductivity-type dopant (containing a first-conductivity-type dopant of higher concentration than first-conductivity-type-dopant diffusing agent 3a) is applied to the light-receiving surface of semiconductor substrate 1 which is the surface at the side where the textured structure is formed, and heat treatment is performed, thereby diffusing the first-conductivity-type dopant from first-conductivity-type-dopant diffusing agent 3b into the surface of semiconductor substrate 1 to form high-concentration first-conductivity-type-dopant diffusion layer 5. Herein, although conditions for the heat treatment of semiconductor substrate 1 are not particularly limited, it is preferable to heat semiconductor substrate 1 under nitrogen atmosphere for more than or equal to 30 minutes and less than or equal to 60 minutes at a temperature more than or equal to 800° C. and less than or equal to 1000° C., from the viewpoint of stably forming high-concentration first-conductivity-type-dopant diffusion layer 5.

Thereafter, as shown in FIG. 6(e), first diffusion preventing mask 2 and first-conductivity-type-dopant diffusing agent 3b are removed from the surface of semiconductor substrate 1, so that high-concentration first-conductivity-type-dopant diffusion layer 5 and low-concentration first-conductivity-type-dopant diffusion layer 16 are exposed at the surface of semiconductor substrate 1.

Then, as shown in FIG. 6(f), an antireflection film 8 is formed on the surface of semiconductor substrate 1 which is the light-receiving surface, and first-conductivity-type-specific electrode 10 made of silver, for example, contacting high-concentration first-conductivity-type-dopant diffusion layer 5 is formed. Passivation film 7 is formed on the back surface of semiconductor substrate 1, and second-conductivity-type-specific electrode 11 made of aluminum and silver, for example, is formed to contact the back surface of semiconductor substrate 1.

The bifacial solar cell with electrodes at the light-receiving surface and the back surface of the semiconductor substrate, respectively, can thus be fabricated by the method of fabricating a solar cell according to the present embodiment.

Description of the present embodiment except the foregoing is similar to those of the first and second embodiments, and is thus omitted.

It is noted that the concept of solar cell according to the present invention covers not only the back electrode type solar cell with both of a first-conductivity-type-specific electrode and a second-conductivity-type-specific electrode formed only at one surface (back surface) of a semiconductor substrate, but also solar cells of any configuration including a so-called back contact solar cell (a solar cell configured to draw out electric current from the back surface of the solar cell opposite to the light-receiving surface), such as a MWT (Metal Wrap Through) cell (a solar cell with electrodes partly arranged in through holes provided in a semiconductor substrate) and a bifacial solar cell fabricated with electrodes formed at the light-receiving surface and the back surface of a semiconductor substrate, respectively.

EXAMPLES

Example

First, a slice damage layer of an n-type silicon wafer having a thickness of about 200 μm was removed with a sodium hydroxide solution to prepare an n-type silicon substrate.

Then, to form a textured structure at a light-receiving surface of the n-type silicon substrate, alkaline treatment was performed by etching the light-receiving surface of the n-type silicon substrate with an alkaline solution.

Then, a masking paste obtained by mixing a predetermined silane compound, an organic solvent, water and the like was printed on the back surface of the n-type silicon substrate as a diffusion preventing mask and dried, thereby forming a masking paste film by patterning in stripes such that the back surface of the n-type silicon substrate was exposed in strip shape. It is noted that the spacing between adjacent masking paste films was 200 μm. Then, the n-type silicon substrate was heat-treated to densify the masking paste film. Herein, the thickness of the densified masking paste film was 400 nm.

Then, an n-type-dopant diffusing agent obtained by mixing a predetermined phosphorus compound, a predetermined silane compound, an organic solvent, and water was printed and patterned in strip shape on the exposed surface of the n-type silicon substrate by inkjet printing so as not to contact the densified masking paste film.

Then, the n-type silicon substrate with the n-type-dopant diffusing agent applied thereto was heat-treated by heating under nitrogen atmosphere for 30 minutes at 900° C. Accordingly, a high-concentration n-type-dopant diffusion layer was formed at the exposed surface portion of the n-type silicon substrate corresponding to the area of the n-type silicon substrate where the n-type-dopant diffusing agent had been applied, and a low-concentration n-type-dopant diffusion layer having an n-type dopant concentration lower than the high-concentration n-type-dopant diffusion layer was formed at the exposed surface region of the n-type silicon substrate around the high-concentration n-type-dopant diffusion layer. Thereafter, the n-type-dopant diffusing agent and the densified masking paste film were all removed with fluoric acid from the n-type silicon substrate.

Then, a masking paste obtained by mixing a predetermined silane compound, an organic solvent, water, and the like was printed on the back surface of the n-type silicon substrate as a diffusion preventing mask and dried, thereby forming a masking paste film by patterning in stripes such that the back surface of the n-type silicon substrate was exposed in strip shape. It is noted that the spacing between adjacent masking paste films was 600 μm. Then, the n-type silicon substrate was heat-treated to densify the masking paste film. Herein, the thickness of the densified masking paste film was 400 nm.

Then, a p-type-dopant diffusing agent obtained by mixing a predetermined boron compound, a predetermined silane compound, an organic solvent, and water was printed and patterned in strip shape on the exposed surface of the n-type silicon substrate by inkjet printing so as not to contact the masking paste film.

Then, the n-type silicon substrate with the p-type-dopant diffusing agent applied thereto was heat-treated by heating under nitrogen atmosphere for 60 minutes at 900° C. Accordingly, a high-concentration p-type-dopant diffusion layer was formed at the exposed surface portion of the n-type silicon substrate corresponding to the area of the p-type silicon substrate where the p-type-dopant diffusing agent had been applied, and a low-concentration p-type-dopant diffusion layer having a p-type dopant concentration lower than the high-concentration p-type-dopant diffusion layer was formed at the exposed surface region of the n-type silicon substrate around the high-concentration p-type-dopant diffusion layer. Thereafter, the p-type-dopant diffusing agent and the densified masking paste film were all removed with fluoric acid from the n-type silicon substrate.

Then, by a plasma CVD technique, a silicon nitride film was formed at the back surface of the n-type silicon substrate, and a silicon nitride film was formed at the light-receiving surface of the n-type silicon substrate.

Then, part of the silicon nitride film at the back surface of the n-type silicon substrate was etched such that each surface of the high-concentration p-type-dopant diffusion layer and the high-concentration n-type-dopant diffusion layer in the back surface of the n-type silicon substrate was partly exposed to form contact holes, and then, a strip-shaped silver electrode contacting the high-concentration p-type-dopant diffusion layer and a strip-shaped silver electrode contacting the high-concentration n-type-dopant diffusion layer were formed, respectively, through the contact holes. The back electrode type solar cell of the Example was thus fabricated.

Comparative Example

A back electrode type solar cell of a Comparative Example was fabricated similarly to the Example except that the surface of an n-type-dopant diffusing agent applied onto the back surface of an n-type silicon substrate was covered with a silicon oxide film, and then an n-type silicon substrate was heat-treated to form an n-type-dopant diffusion layer, and that the surface of a p-type-dopant diffusing agent applied onto the back surface of the n-type silicon substrate was covered with a silicon oxide film, and then the n-type silicon substrate was heat-treated to form a p-type-dopant diffusion layer.

<Evaluation>

Evaluations of short-circuit current density ($J_{sc}$), open circuit voltage ($V_{oc}$), fill factor (F.F.), and conversion efficiency ($E_{ff}$) were conducted on the back electrode type solar cell of the Example and the back electrode type solar cell of the Comparative Example fabricated as described above, respectively, using a solar simulator. The results are shown in Table 1.

It is noted that Table 1 indicates relative values of short-circuit current density ($J_{sc}$), open circuit voltage ($V_{oc}$), fill factor (F.F.), and conversion efficiency ($E_{ff}$) of the back electrode type solar cell of the Comparative Example when values of short-circuit current density ($J_{sc}$), open circuit voltage ($V_{oc}$), fill factor (F.F.), and conversion efficiency ($E_{ff}$) of the back electrode type solar cell of the Example are assumed as 100, respectively.

TABLE 1

| | Short-circuit current density ($J_{sc}$) | Open circuit voltage ($V_{oc}$) | Fill factor (F.F.) | Conversion efficiency ($E_{ff}$) |
|---|---|---|---|---|
| Example | 100 | 100 | 100 | 100 |
| Comparative Example | 96.04 | 94.77 | 81.10 | 73.78 |

As shown in Table 1, the back electrode type solar cell of the Example was superior to the back electrode type solar cell of the Comparative Example in any of short-circuit current density ($J_{sc}$), open circuit voltage ($V_{oc}$), fill factor (F. F.), and conversion efficiency ($E_{ff}$).

This is considered because, in the back electrode type solar cell of the Example, the dopant diffusing agents were applied at a spacing from the silicon oxide films as the diffusion preventing masks at the back surface of the n-type silicon substrate, which could prevent the dopants in the dopant diffusing agents from being moved into the diffusion preventing masks.

Another reason is that, in the back electrode type solar cell of the Example, the silicon oxide films as the diffusion preventing masks at the back surface of the n-type silicon substrate allowed the p-type-dopant diffusion layer and the n-type-dopant diffusion layer to be formed at positions in the semiconductor substrate where the p-type-dopant diffusion layer and the n-type-dopant diffusion layer did not contact each other.

It should be construed that embodiments and examples disclosed herein are by way of illustration in all respects, not by way of limitation. It is intended that the scope of the present invention is defined by claims, not by the description above, and includes all modifications equivalent in meaning and scope to the claims.

INDUSTRIAL APPLICABILITY

According to the present invention, a method of fabricating a semiconductor device capable of controlling reduction in dopant concentration in dopant diffusion layers to prevent degradation in characteristics of the semiconductor device can be provided.

Particularly, the method of fabricating a semiconductor device according to the present invention can be suitably used as a method of fabricating a solar cell.

REFERENCE SIGNS LIST

1 semiconductor substrate; 2 first diffusion preventing mask; 3, 3a, 3b first-conductivity-type-dopant diffusing agent; 4 second-conductivity-type-dopant diffusing agent; 5 high-concentration first-conductivity-type-dopant diffusion layer; 6 high-concentration second-conductivity-type-dopant diffusion layers; 7 passivation film; 8, 108, 208 textured structure; 9, 209 antireflection film; 10 first-conductivity-type-specific electrode; 10a first-conductivity-type-specific current-collecting electrode; 11 second-conductivity-type-specific electrode; 11a second-conductivity-type-specific current-collecting electrode; 12, 13 contact hole; 16 low-concentration first-conductivity-type-dopant diffusion layer; 17 low-concentration second-conductivity-type-dopant diffusion layer; 21 second diffusion preventing mask; 100, 200 silicon substrate; 101 low-concentration n-type dopant source; 102 high-concentration n-type dopant source; 103 low-concentration p-type dopant source; 104 high-concentration p-type dopant source; 105 high-concentration n-type-dopant diffusion layer; 106 high-concentration p-type-dopant diffusion layer; 115 low-concentration p-type-dopant diffusion layer; 116 low-concentration n-type-dopant diffusion layer; 202 oxide layer; 203 p-type doping paste; 204 n-type doping paste; 205 p-type-dopant diffusion layer; 206 n-type-dopant diffusion layer; 210, 211 metallized portion.

The invention claimed is:

1. A method of fabricating a semiconductor device, including the steps of:
   forming a diffusion preventing mask on a surface of a semiconductor substrate, wherein said diffusion preventing mask is formed to be patterned by printing;
   applying a dopant diffusing agent containing a dopant of one of a first conductivity type and a second conductivity type onto said surface of said semiconductor substrate at a spacing from said diffusion preventing mask so as not to contact the diffusion preventing mask; and
   forming a dopant diffusion layer by diffusing said dopant from said dopant diffusing agent into said semiconductor substrate.

2. The method of fabricating a semiconductor device according to claim 1, wherein in said step of forming said diffusion preventing mask, said diffusion preventing mask is formed such that a spacing between adjacent diffusion preventing masks is more than or equal to 100 μm.

3. The method of fabricating a semiconductor device according to claim 1, wherein in said step of applying said dopant diffusing agent, said dopant diffusing agent is applied to be patterned by printing.

\* \* \* \* \*